United States Patent
Bitko et al.

[11] Patent Number: 5,951,893
[45] Date of Patent: Sep. 14, 1999

[54] INTEGRATED CIRCUIT PAD STRUCTURE WITH HIGH TEMPERATURE HEATING ELEMENT AND METHOD THEREFOR

[75] Inventors: Gordon Bitko; Gary O'Brien, both of Phoenix, Ariz.

[73] Assignee: Motorola, Inc., Schaumburg, Ill.

[21] Appl. No.: 08/872,803

[22] Filed: Jun. 10, 1997

Related U.S. Application Data

[63] Continuation of application No. 08/567,697, Dec. 5, 1995, abandoned.

[51] Int. Cl.$^6$ .............. H05B 3/02; B23K 11/16; H05K 1/18
[52] U.S. Cl. ............ 219/209; 219/56.22; 219/480; 228/180.22; 361/764; 361/768
[58] Field of Search .............. 219/56, 56.1, 56.21, 219/56.22, 50, 209, 200, 210, 476–480; 361/760, 763, 764, 768, 779; 439/83; 228/180.21, 180.22; 29/840, 843

[56] References Cited

U.S. PATENT DOCUMENTS

| | | | |
|---|---|---|---|
| 3,289,046 | 11/1966 | Carr | 219/209 |
| 3,353,263 | 11/1967 | Helms | 219/56.21 |
| 4,356,379 | 10/1982 | Graeme . | |
| 4,374,316 | 2/1983 | Inamori et al. | 219/209 |
| 4,481,403 | 11/1984 | Monte | 219/209 |
| 4,582,975 | 4/1986 | Daughton | 219/209 |
| 4,739,382 | 4/1988 | Blouke et al. | 257/469 |
| 4,808,009 | 2/1989 | Sittler et al. . | |
| 4,908,696 | 3/1990 | Ishihara et al. | 257/713 |
| 5,010,233 | 4/1991 | Henschen et al. | 219/209 |
| 5,233,327 | 8/1993 | Bartush et al. . | |
| 5,309,090 | 5/1994 | Lipp | 219/209 |
| 5,329,093 | 7/1994 | Okano | 219/209 |
| 5,466,484 | 11/1995 | Spraggins et al. . | |

FOREIGN PATENT DOCUMENTS

| 299855 | 12/1988 | Japan . |
|---|---|---|
| 201954 | 7/1994 | Japan . |

OTHER PUBLICATIONS

IBM Technical Disclosure Bulletin, Haddad et al., vol. 12, No. 8, Jan. 1970.
IBM Technical Disclosure Bulletin, vol. 11, No. 3, Aug. 1968.
IBM Technical Disclosure Bulletin, vol. 21, No. 8, Jan. 1979.
IBM Technical Disclosure Bulletin, vol. 14, No. 8, Jan. 1972.
IBM Technical Disclosure Bulletin, vol. 31, No. 11, Apr. 1989.

*Primary Examiner*—Tu Ba Hoang
*Attorney, Agent, or Firm*—Gary W. Hoshizaki; Sharon K. Coleman; Lanny L. Parker

[57] ABSTRACT

Heater circuits (13) are placed in close proximity or integrated with connection points (12) of an integrated circuit. A connection point is an area where a wire bond or conductive bump is coupled for providing electrical interconnection external to an integrated circuit. Heater circuits (13) are polysilicon strips that form resistive heat elements. A DC voltage or a pulsed voltage is applied to the heater circuits (13) to generate a local heat at the connection points that can reach temperatures exceed 1000 degrees centigrade. The heat is localized to an area near the connection point to prevent damage to temperature sensitive material. The heater circuits (13) raise the temperature of the connection points (12) to increase bond strength of a wire bond or to reflow a conductive bump to adhere to a connection point of another substrate.

17 Claims, 2 Drawing Sheets

INTEGRATED CIRCUIT PAD STRUCTURE WITH HIGH TEMPERATURE HEATING ELEMENT AND METHOD THEREFOR

This application is a continuation of Ser. No. 08/567,697 filed Dec. 5, 1995, now abandoned.

BACKGROUND OF THE INVENTION

This invention relates, in general, to integrated circuits, and more particularly, to external interconnect bonding to a connection point of an integrated circuit.

In general, an integrated circuit typically has an array of metal pads or connection points for external coupling from the semiconductor die. The metal pads or connection points couple signals into and out of an integrated circuit. An example of an external interconnection to an integrated circuit is a wire coupling a metal pad of the integrated circuit to a lead of a lead frame. The wire electrically couples the wire to the lead. A combination of pressure and heat allows the wire to bond or adhere to the metal pad. Applying heat during a wire bond process increases the adhesion of a wire to a metal pad. The leads of a lead frame package couple the integrated circuit to circuitry external to the semiconductor package.

The conductive bump technology used in a multi-chip module is another type of external interconnection for electrically coupling to an integrated circuit. A multi-chip module typically interconnects a number of integrated circuits via a common substrate. The common substrate has metal pads or connection points that align to connection points of an integrated circuit. In general, a solder bump or other conductive material is formed on the connection points of an integrated circuit, the common substrate, or both. The integrated circuit is electrically coupled to the common substrate by aligning the integrated circuit to the common substrate and heating the structures until the conductive material on each connection point flows thereby coupling connection points of both the integrated circuit and the common substrate. The conductive material physically and conductively attaches the integrated circuit to the common substrate. In both wire bond and conductive bump interconnect the entire integrated circuit is heated which subjects the semiconductor die to temperatures that could damage the circuitry. Also, the heating process is not easily controlled and increases manufacturing costs.

It would be of great benefit if a structure and process could be provided that reduces the cost and manufacturing complexity of providing external connection to an integrated circuit.

DETAILED DESCRIPTION OF THE DRAWINGS

Figure 1:
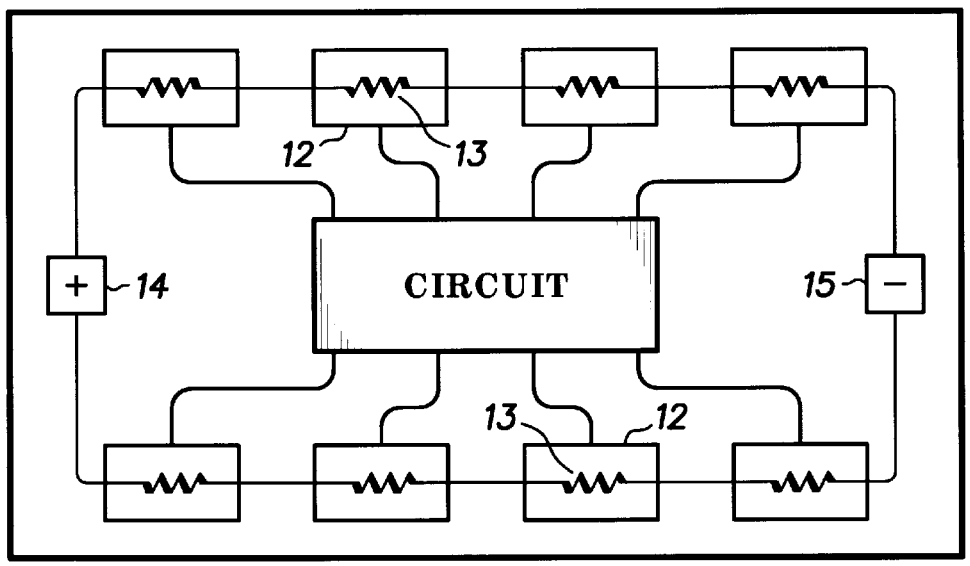
FIG. 1 is an illustration of a semiconductor die having heater circuits formed within connection points in accordance with the present invention.

In general, an integrated circuit is electrically coupled to other circuitry. An integrated circuit has metal pads or connection points on the semiconductor die specifically for coupling electrical signals into or out of the integrated circuit. Often, an external interconnection such as a wire or conductive bump is used to couple a connection point of an integrated circuit to some point external to the integrated circuit.

A wire bond is an external connection to an integrated circuit that is well known to one skilled in the art. Typically, wire bonding is used to connect a metal pad of an integrated circuit to a lead of a semiconductor package. A wire is bonded to a metal pad of an integrated circuit by pressing the wire into the pad. Adhesion of the wire to the pad is enhanced by performing wire bonding at an elevated temperature. Heating of the integrated circuit is typically accomplished via a conductive hot plate. The integrated circuit and any portion of a semiconductor package formed around the semiconductor die is heated to a temperature between 200–250 degrees centigrade for a wire bond process.

Heating a semiconductor die with a conductive hot plate is not practical for all wire bond processes. The conductive hot plate also heats the semiconductor package to which the semiconductor die is mounted. A problem could occur if any element of the semiconductor package or semiconductor die is not stable or can be damaged at the elevated temperature. For example, semiconductor packages are formed from many types of materials. One group of materials are epoxy encapsulants that mold around an integrated circuit to form a package housing. To heat the integrated circuit during a wire bond process the semiconductor package housing must rest on the conductive hot plate to transfer heat to the semiconductor die. For some epoxy encapsulants, the temperature at which the semiconductor die is heated for a wire bond process may approach the melting point of the epoxy encapsulant which would destroy the semiconductor package. Also, an epoxy encapsulant may outgas toxic fumes at elevated temperatures which would require expensive equipment to trap and store. Another factor is the integrated circuit may not be heated to the appropriate temperature if the epoxy encapsulant is a poor thermal conductor. A poor thermal conductor would require an increase in the hot plate temperature and increase manufacturing cycle time due to the added time required for the semiconductor die to reach the appropriate temperature. All of these problems stem from the fact that the entire structure has to be heated to raise the temperature of the connection points of the integrated circuit.

A conductive bump is another well known form of external interconnect where a semiconductor die is heated to connect to a connection point of another substrate. A conductive material such as solder or aluminum is formed as a bump or ball on the connection points of an integrated circuit. The conductive bumps extend above the surface of the integrated circuit. The integrated circuit is aligned to corresponding connection points of a circuit board or substrate for electrically coupling thereto. Typically, the entire structure (integrated circuit and substrate) is heated until the conductive bumps begin to flow thereby adhering to the connection points of both the integrated circuit and substrate. Reflow of the conductive bumps is achieved by heating the integrated circuit and substrate in a furnace.

One common problem with heating the entire structure is stress in the bond joints due to uneven heating of the integrated circuit and substrate. It is very difficult to evenly heat the entire structure. Stress in the bond joints produces stress on the integrated circuit and substrate. Another problem is a small temperature window in which the integrated circuit and substrate can be heated. Materials used in the integrated circuit or the substrate may be damaged if a certain temperature is exceeded. In other cases, the heating process may be impractical. For example, assume the conductive bumps were formed of aluminum. Aluminum has a melting point of approximately 600 degrees centigrade. Heating the integrated circuit and the substrate to a temperature in which aluminum flows would at the very least alter the operating characteristics and affect reliability or produce irreparable damage.

In either the wire bond or conductive bump examples stated hereinabove the entire integrated circuit is heated. In practice, all that is required is to heat the connection point or metal pad areas of the integrated circuit to securely fasten an external interconnect. A better method of heating is achieved by providing heat only to connection points of the integrated circuit. Localized heating is achieved by forming heater circuits on or near connection points of an integrated circuit. A heater circuit is a resistive element that dissipates heat when a voltage is applied across the element. A heater circuit rapidly heats a connection point to aid in a bonding or reflow process for external interconnect without heating the entire integrated circuit. In fact, extremely high localized temperatures exceeding 1,000 degrees centigrade can be generated at a connection point with a heater circuit without significantly heating the semiconductor die.

FIG. 1 is an illustration of a semiconductor die 11 having heater circuits 13 formed within connection points 12. In general, connection points 12 are formed on a periphery of a semiconductor die but are not restricted to this location. Connection points can be placed throughout the central area of a semiconductor die if all the connection points of a circuit cannot be accommodated on the die periphery. Heater circuits 13 are coupled in series between connection points 14 and 15. Heater circuits 13 could also be coupled in parallel. A voltage is applied across connection points 14 and 15 for heating connection points 12. Typically, heater circuits 13 are matched to one another by forming each structure identically such that each dissipates equivalent power and produces the same temperature at each connection point 12. Voltage to heater circuits 13 applied across connection points 14 and 15 can be provided continuously (DC) or pulsed.

Figure 2:
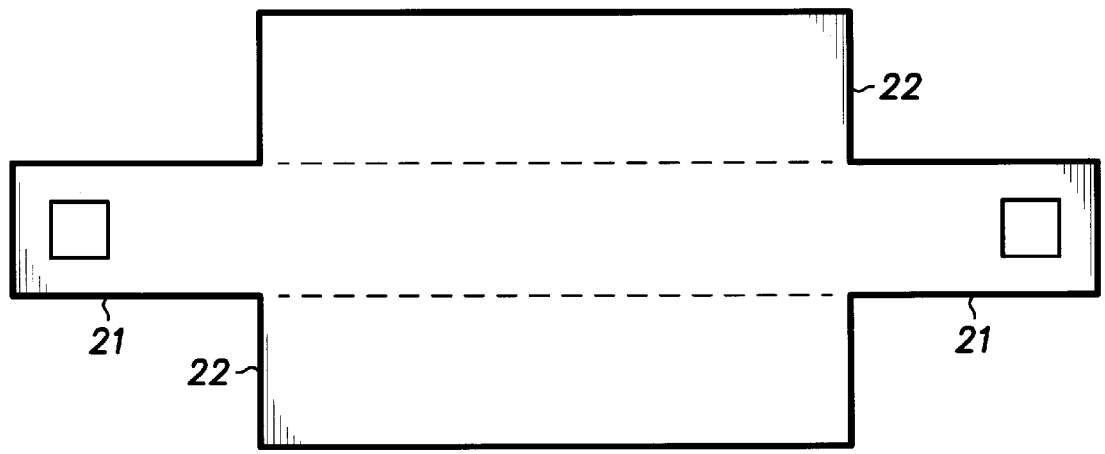
FIG. 2 is a top view of a heater circuit and a connection point in accordance with the present invention.

FIG. 2 is a top view of a heater circuit 21 and a connection point 22. Heater circuit 21 is a resistor element formed of polysilicon or some other resistive material common to semiconductor wafer processes. Connection point 22 is a conductive material such as solder, conductive epoxy, gold, silver, or aluminum to which an external interconnect is coupled.

Figure 3:
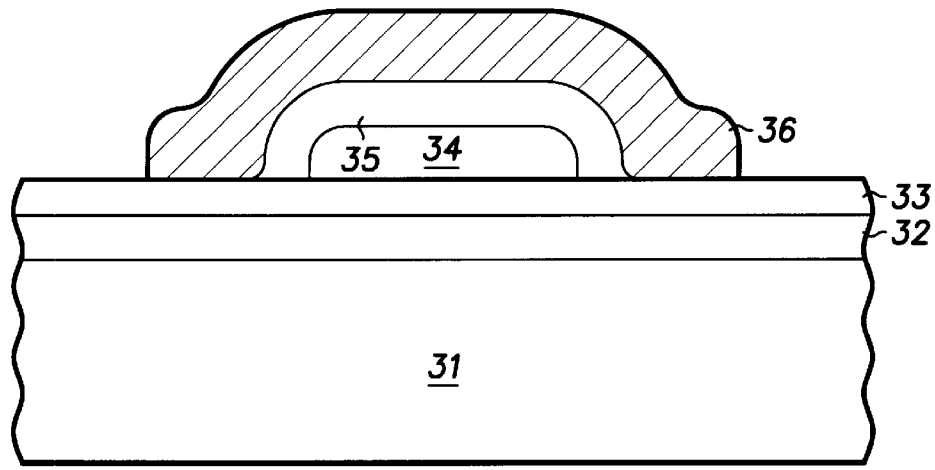
FIG. 3 is a cross-sectional view of an embodiment of a connection point and heater circuit in accordance with the present invention.

FIG. 3 is a cross-sectional view of an embodiment of a connection point and a heater circuit. The structure is formed on a substrate 31. For example, silicon or other semiconductor substrates are suitable substrate material. In general, the heater circuit is formed underneath the connection point. The heater circuit is electrically isolated from a substrate and a connection point by layers of a non-conductive material.

A thermal oxide layer 32 is formed on substrate 31. Thermal oxide layer 32 is grown to a thickness of 3,000 angstroms. A pyro-silicate oxide layer 33 is formed on thermal oxide layer 32. Pyro-silicate oxide layer 33 is grown to a thickness of 3,000 angstroms. Thermal oxide layer 32 and pyro-silicate oxide layer 33 isolate the heater circuit and connection point from substrate 31. A polysilicon strip 34 is formed as the heater circuit. Polysilicon strip 34 is formed on pyro-silicate oxide layer 33. Polysilicon strip 34 is formed to a thickness of approximately 5,000 angstroms. A pyro-silicate oxide layer 35 is formed over polysilicon strip 34. Pyro-silicate oxide layer 35 is grown to a thickness of approximately 3,000 angstroms. An aluminum pad 36 or aluminum conductive bump is formed on pyro-silicate oxide layers 33 and 35. Pyro-silicate oxide layer 35 electrically isolates polysilicon strip 34 from aluminum pad 36. Aluminum pad 36 is formed to a thickness of approximately 15,000 angstroms.

Aluminum pad 36 corresponds to a pad or a conductive bump of an integrated circuit. Other conductive materials such as solder, a conductive epoxy, gold, silver, or copper could also be used in place of aluminum pad 36 depending on the type of external interconnect being used. A voltage applied across polysilicon strip 34 produces heat that is conducted through pyro-silicate oxide 35 to aluminum pad 36. The temperature to which aluminum pad 36 is heated is controlled by the voltage or current applied across the heater circuit and the time period of the applied voltage which is adjusted for the conductive material being used and the type of external interconnection to the integrated circuit.

Figure 4:
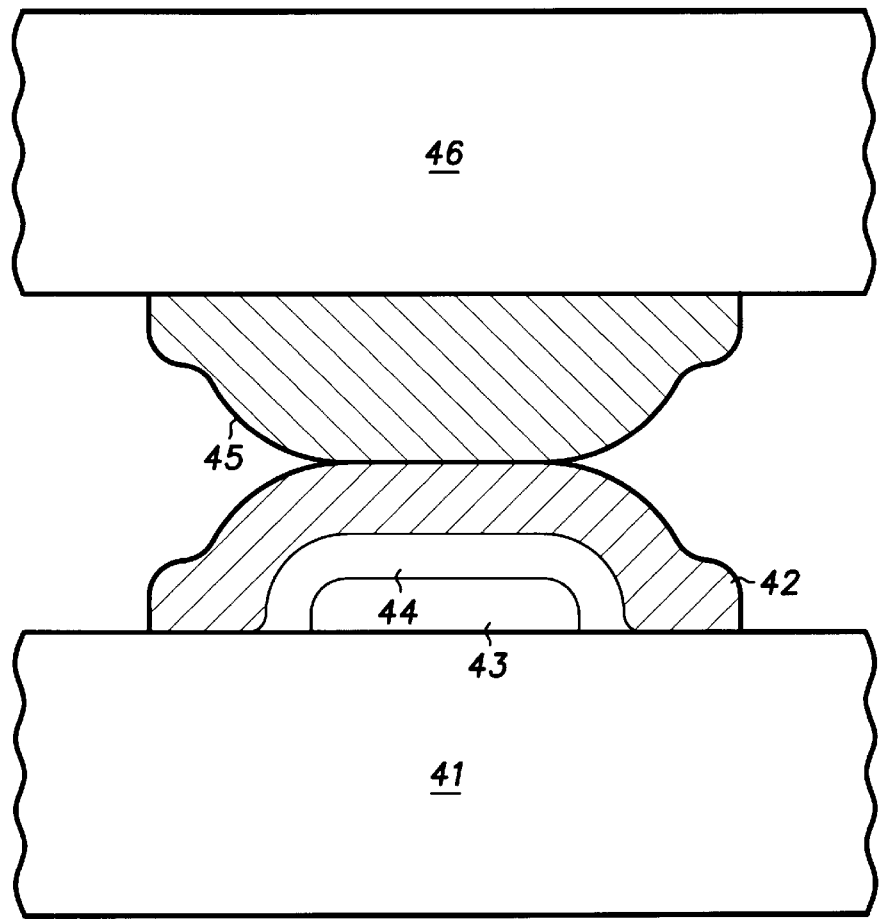
FIG. 4 is a cross-sectional view of an aluminum bump being heated by a heater circuit to couple with an aluminum bump of another substrate in accordance with the present invention.

FIG. 4 is a diagram, of an aluminum bump 42 being melted by a heater circuit 43. Aluminum bump 42 is a connection point of an integrated circuit formed on a semiconductor substrate 41. The connection points of the integrated circuit couple to corresponding connection points of a substrate 46. Heater circuit 43 is formed underneath aluminum bump 42. Heater circuit 43 is electrically isolated from aluminum bump 42 by oxide layer 44.

An aluminum bump 45 is formed on substrate 46 for conducting an electrical signal. Aluminum bump 45 aligns and makes contact to aluminum bump 42 prior to heater circuit 43 being activated. Heater circuit 43 heats and reflows aluminum bump 42 to bond (or merge) with aluminum bump 45. Aluminum bumps 42 and 45 are physically and electrically coupled together after reflow. Stress on the integrated circuit and substrate is minimized since heater circuits on the semiconductor die can be matched to produce nearly identical temperatures at each connection point. Heat is localized to a connection point area preventing damage to heat sensitive materials. Expensive heating equipment is eliminated and manufacturing cycle time reduced since the structure is integrated on the semiconductor die and is capable of heating a connection point in an extremely short time period.

Reflow of aluminum bumps is an example of an external interconnection that could not be accomplished by heating the entire integrated circuit and substrate. The melting point of aluminum exceeds 600 degrees centigrade. Damage would almost certainly occur if the entire integrated circuit is heated to such a temperature. Other external interconnection processes such as a gold/tin eutectic bond common to a wire bond process is heated to a much lower temperature (approximately 280 degrees centigrade). Heater circuit 43 is capable of heating a connection point to a temperature greater than 1,000 degrees centigrade without damaging circuitry of an integrated circuit. First, the heat remains localized to the connection point area because it reaches a high temperature very rapidly allowing the process of external interconnection to take place very rapidly (wire bond or conductive bump). Second, the size of the heater circuit heats an area that is small in comparison to the size of the integrated circuit. Thus, the power transferred to the semiconductor die in total is very small, producing only a minor change in temperature that would not damage the integrated circuit.

An example of a heater circuit is a polysilicon strip having a length of 100 microns and a width of 50 microns. A sheet resistance of 35 ohms per square produces a resistance of 70 ohms for the heater circuit. A connection point temperature exceeding 1,000 degrees centigrade is achieved by voltage pulsing the heater circuit. The voltage pulse to achieve a 1,000 degrees centigrade connection point temperature has a voltage magnitude of 60 volts and a pulse duration of 50 microseconds. Lower temperatures are produced by lowering the pulse voltage or reducing the pulse duration or a combination of the both. Alternately, a current pulse could be used to activate a heater circuit. The temperature at the connection point is determined by the magnitude of the current pulse and its duration.

By now it should be appreciated that a circuit and method for bonding to an integrated circuit has been provided. Heater circuits are integrated on a semiconductor die and are placed in close proximity to connection points for external interconnection of an integrated circuit. The heater circuits provide localized heat for aiding in a bonding process such as wire bonding or reflow of conductive bumps. Extremely high temperatures can be generated at a connection point without significantly heating the integrated circuit or other componentry.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A method for reflowing aluminum pads of an integrated circuit for interconnection, the method comprising the steps of:

forming an aluminum bump on a plurality of pads of the integrated circuit;

forming a heater circuit beneath each pad of said plurality of pads of the integrated circuit;

applying a voltage pulse to each heater circuit; and reflowing said aluminum bump for interconnection.

2. The method as recited in claim 1 wherein said step of forming a heater circuit includes a step of forming each heater circuit as a polysilicon strip placing a polysilicon strip beneath each pad of said plurality of pads of the integrated circuit.

3. The method as recited in claim 2 wherein said step of placing a polysilicon strip beneath each pad of said plurality of pads of the integrated circuit includes a step of placing an oxide layer between each polysilicon strip and a corresponding pad.

4. The method as recited in claim 2 wherein said step of forming each heater circuit as a polysilicon strip includes a step of matching each polysilicon strip to have identical dimensions.

5. The method as recited in claim 2 wherein said step of forming each heater circuit as a polysilicon strip includes a step coupling each polysilicon strip serially to one another.

6. A pad structure for an integrated circuit comprising:

a substrate;

a first isolation layer formed above said substrate;

a polysilicon strip formed above said first isolation layer wherein said first isolation layer electrically isolates said polysilicon strip from said substrate and wherein said polysilicon strip is a heater element for heating a pad;

a second isolation layer formed above said polysilicon strip; and a conductive material formed above said second isolation layer, said second isolation layer electrically isolates said metal pad from said polysilicon strip and said conductive material forming the pad for coupling to the integrated circuit.

7. The pad structure as recited in claim 6 wherein said conductive material forming the pad is aluminum.

8. The pad structure as recited in claim 6 further including an aluminum conductive bump formed on said conductive material.

9. The pad structure as recited in claim 6 further including a conductive epoxy bump formed on said conductive material.

10. The pad structure as recited in claim 6 further including a conductive solder bump formed on said conductive material.

11. A method of heating a connection point of an integrated circuit for electrical interconnection external to the integrated circuit, the method comprising the steps of:

forming a heater circuit at the connection point of the integrated circuit; and pulsing a voltage to the heater circuit to heat the connection point which allows a higher temperature to be generated at the connection point while minimizing power dissipated to the integrated circuit.

12. The method as recited in claim 11 further including a step of bonding a wire to the connection point as the connection point is heated to increase adhesion of a wire bond.

13. The method as recited in claim 11 further including a step of heating the connection point until a conductive material forming the connection point reflows.

14. The method as recited in claim 11 wherein the step of forming a heater circuit includes the steps of:

forming the heater circuit as a polysilicon strip; and placing the polysilicon strip beneath the connection point of the integrated circuit.

15. The method as recited in claim 14 wherein the step of placing the polysilicon strip beneath the connection point of the integrated circuit includes a step of placing an oxide layer between the polysilicon strip and the connection point.

16. The method as recited in claim 14 wherein the step of forming the heater circuit as a polysilicon strip includes a step of matching a plurality of polysilicon strips wherein each polysilicon strip of the plurality is placed beneath a corresponding connection point of the integrated circuit to have identical dimensions.

17. The method as recited in claim 14 wherein the step of forming the heater circuit as a polysilicon strip includes a step of coupling a plurality of polysilicon strips serially to one another.

* * * * *